United States Patent
Robertazzi

(10) Patent No.: US 7,408,373 B2
(45) Date of Patent: Aug. 5, 2008

(54) DEVICE FOR PROBE CARD POWER BUS VOLTAGE DROP REDUCTION

(75) Inventor: Raphael Peter Robertazzi, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 152 days.

(21) Appl. No.: 11/468,938

(22) Filed: Aug. 31, 2006

(65) Prior Publication Data

US 2007/0013386 A1    Jan. 18, 2007

Related U.S. Application Data

(63) Continuation of application No. 11/242,864, filed on Oct. 5, 2005, now Pat. No. 7,187,194, which is a continuation of application No. 11/067,755, filed on Mar. 1, 2005, now Pat. No. 7,005,879.

(51) Int. Cl.
*G01R 31/26* (2006.01)

(52) U.S. Cl. ................................................ 324/765

(58) Field of Classification Search .............. 324/754, 324/761–762, 763, 765, 115, 158.1; 714/742, 714/717; 327/310, 379, 384; 307/43, 64
See application file for complete search history.

(56) References Cited

U.S. PATENT DOCUMENTS

| 4,508,981 | A | 4/1985 | Dorler et al. ............... 327/310 |
|---|---|---|---|
| 5,241,226 | A | 8/1993 | Rossi et al. ................. 327/384 |
| 5,463,315 | A | 10/1995 | Grace et al. ............. 324/158.1 |
| 5,594,359 | A * | 1/1997 | Hashimoto ................. 324/765 |
| 6,456,103 | B1 * | 9/2002 | Eldridge et al. ............ 324/765 |
| 6,621,287 | B2 * | 9/2003 | Abazarnia et al. .......... 324/765 |
| 2002/0125904 | A1 | 9/2002 | Eldridge et al. ............ 324/765 |

OTHER PUBLICATIONS

ISSCC2000/Session 26/Analog Techiques/paper WP 26.7, Michael Ang. et al., "An On-Chip Voltage Regulator Using Switched Decoupling Capacitors", Sun MicroSystems, Inc. Palo Alto, Ca, pp. 438-439, Digest of Technical Papers.

Intel Test Tooling Operations, Intel Corporation, S. Mobin et al., 2004 South West Test Workshop, pp. 1-21 "Power Delivery Challenges of High Power Logic Device at Sort".

* cited by examiner

*Primary Examiner*—Ha Nguyen
*Assistant Examiner*—Tung X Nguyen
(74) *Attorney, Agent, or Firm*—Whitham, Curtis, Christofferson & Cook, PC; Anne V. Dougherty

(57) ABSTRACT

Noise reduction for application of structural test patterns to a Device Under Test (DUT) is accomplished with a capacitor "booster" bypass network on the probe card in which the capacitors are charged to a much higher voltage $V_{boost}$ than the DUT power supply voltage VDD. Charging the capacitors to a voltage N×VDD allows the buster network to store N times the charge of a conventionally configured capacitance network, and effectively provides N times the capacitance of the original network in the same physical space.

1 Claim, 5 Drawing Sheets

DEVICE FOR PROBE CARD POWER BUS VOLTAGE DROP REDUCTION

CROSS-REFERENCE TO RELATED APPLICATIONS

This application is a continuation of U.S. patent application Ser. No. 11/242,864 filed Oct. 5, 2005, now allowed and U.S. Pat. No. 7,187,194, which itself is a continuation of U.S. Pat. No. 7,005,879 based on U.S. patent application Ser. No. 11/067,755 filed Mar. 1, 2005, and the complete contents of both applications is herein incorporated by reference.

BACKGROUND OF THE INVENTION

1. Field of the Invention

The present invention generally relates to electronic test circuits and, more particularly, to testing microelectronics at wafer level.

2. Background Description

The test of state of the art microelectronics at wafer level often requires the application of structural test patterns to the Device Under Test (DUT). In a structural test, the DUT is loaded with an input pattern of test vectors, a single clock cycle is applied, and the resultant output vector is read out. Often this test sequence is repeated many times during the course of the test, in rapid succession. When the DUT contains a large number of transistors, this test sequence invariably produces a voltage noise pulse on the power planes of the probe card used to bias the DUT. The noise spike is produced by momentary increase in current drawn by the chip during the test cycle. This noise spike cannot be fully compensated by the on chip decoupling capacitor network. Depending on the total number of structural test cycles, the DUT may draw its full operating current over a time scale from nanoseconds (ns) to hundreds of milliseconds (ms) which can produce power supply voltage transients with these durations. These voltage noise spikes (which momentarily reduce the power supply voltage applied to the DUT) can cause the DUT to fail the applied test pattern if the voltage reduction is severe enough, event though the DUT is defect free. It should be pointed out that, because of the transient nature of structural test patterns, it is impossible to eliminate these voltage noise spikes by the application of conditioning cycles prior to the test. To mitigate the effects of voltage noise spikes, hardware test engineers have traditionally employed several different solutions, depending on the duration of the spike. The power supply transients associated with DUT test can be broadly categorized into three time scales:

Time scales in the 0.1 to 100 millisecond range are generally within the response times of DC power supplies, connected in conventional ways. However, as the current requirements of the DUT have increased, and voltage levels have decreased, even these longer time voltage transients have become more difficult to tame, because they have become larger in amplitude. To address power spikes in this time scale range the trend has been to employ advanced, high performance power supplies (often called Point of Load or POL supply) with faster response times, located closer to the DUT. However, even with the best POL power supply electronics, practical considerations (the regulation units are physically large and hence cannot be located on the probe card, the probe card/power supply interface contains significant inductive parasitics, etc.) make the fastest response times of these units 5 microseconds or greater.

Voltage noise spikes of shorter duration, from 1 ns to 10 microseconds (10 µs) are generally compensated by decoupling capacitor networks mounted on the probe card. The capacitors are mounted as close to the DUT as is practical, to reduce the response time of the bypass network to the voltage noise spike. However, as the level of integration of silicon circuits has increased, voltage supply levels have decreased and current requirements have increased. Increasing DUT supply current requirements in combination with a fixed probe card area for the mounting of decoupling capacitors is making it impossible to provide enough bypass capacitance to adequately reduce voltage noise spikes in the 1 ns to 10 µs time range when testing state of the art components with very high supply currents (~100 amps). Adding more capacitance farther away from the DUT is not effective for reducing high frequency noise spikes because the time constant of the bypass network becomes too great. The size of capacitors is limited too; using capacitors with larger capacitance values in the same area is ineffective if the larger capacitors have larger Equivalent Series Inductance (ESL) or Equivalent Series Resistance (ESR) values. Although many different technologies are available for capacitors, one rule generally holds true: as technologies are employed with a higher capacitance to volume ratio (specific capacitance), ESL and ESR increase, making them less effective at filtering the higher frequency voltage spikes. This restricts the capacitors used to filter transients in the 1 ns to 10 µs range to high performance, low ESR and ESL types with low specific capacitance values, which limits the total capacitance of the network because of the limited space available on the probe card close to the DUT.

Voltage spikes of duration under 1 ns are typically effectively filtered by on chip bypass capacitance networks.

There is a large body of literature on power bus noise reduction and active noise filtering. Some relevant references are listed below:

Ang, M., Salem, R., and Taylor T, "An On Chip Voltage Regulator Using Switched Decoupling Capacitors", ISSCC 200, WP27.7, pp. 438-439 (2000)

Mobin, S., and Shu, K., "Power Delivery Challenges of High Power Logic Device at Sort", Presented at Soutwest Test Workshop, June 2004

SUMMARY OF THE INVENTION

This invention addresses the problem of reducing probe card power supply spikes in the intermediate range, from 1 ns to 10 µs time scale range where the traditional probe card capacitor bypass network solution is becoming ineffective. The device according to the present invention addresses this problem by using active regulation circuitry mounted directly on the probe card. This approach leads to a large improvement in the regulation of the voltage bus over a conventional passive capacitor bypass of the same net capacitance value.

The core idea of this invention is to use a capacitor "booster" bypass network on the probe card in which the capacitors are charged to a much higher voltage $V_{boost}$ than the DUT power supply voltage VDD. Charging the capacitors to a voltage N×VDD allows the booster network to store N times the charge of a conventionally configured capacitive bypass network. This enables this booster network to provide current to the DUT for N times longer than a conventionally configured network of equal capacitance for a given power supply voltage drop. The high voltage capacitor network is used in conjunction with active regulation circuitry on the probe card, to supply current as required by the DUT during periods of intense power bus loading (during structural test sequences, for example). The use of an active bypass network has two major advantages:

1. Capacitors used in the bypass network can be utilized to their full charge storage potential (maximum reserve charge/unit area of board space). This allows the maximum utilization (best bypass performance/capacitor mounted) of dwindling board space for these components. This is particularly important for low ESL and ESR capacitors because of their lower specific capacitance values.

2. Active regulation of the bypass network allows much more tightly controlled regulation of the power bus, for a given total bypass capacitance than for a passive network alone.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
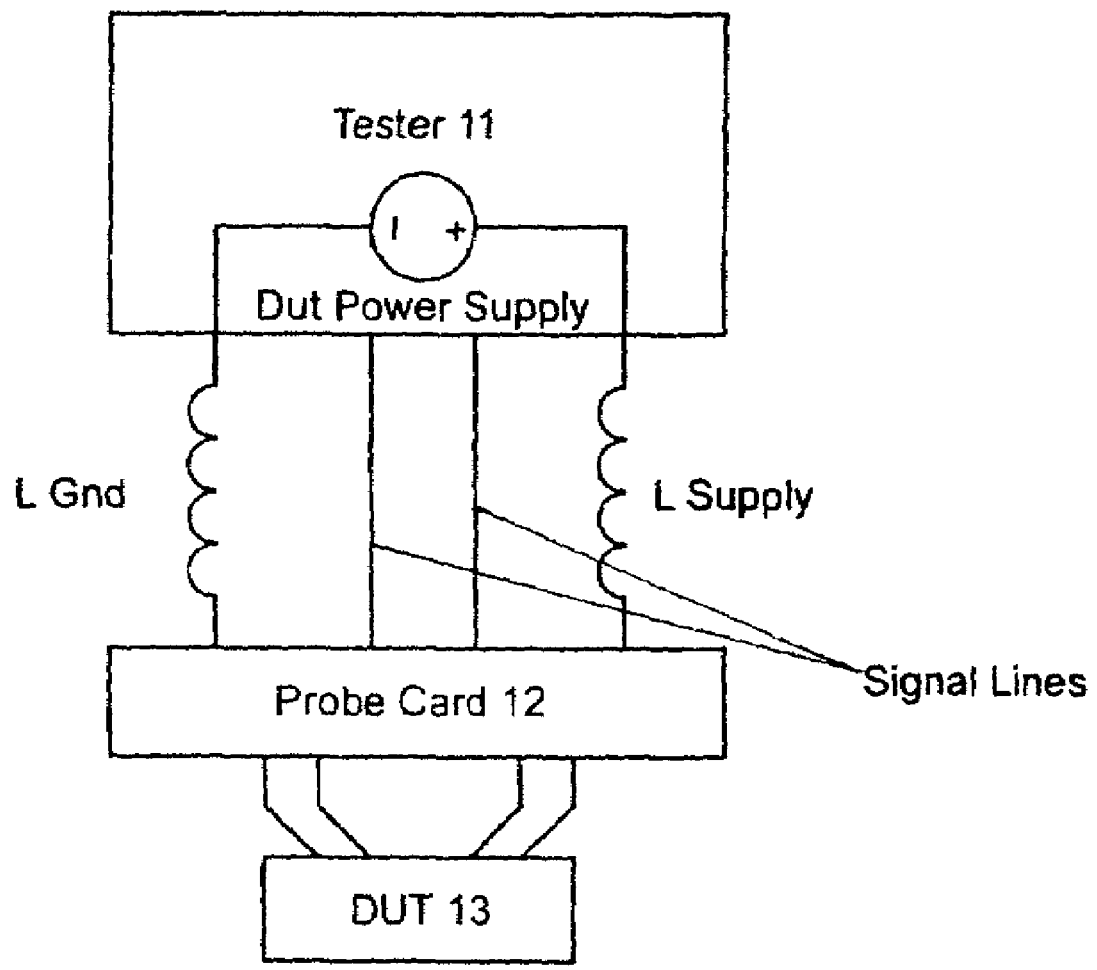
FIG. 1 is a block and schematic diagram of a typical test set up for wafer level integrated circuit test.

Referring now to the drawings, and more particularly to FIG. 1, there is shown a system for testing integrated circuits. In its most basic form, the system consists of a tester 11, probe card 12, and integrated circuit 13, or DUT. The tester provides both power and stimulus to the DUT. The probe card provides the interface between the tester and DUT, and includes a power distribution system, which often includes passive elements mounted on the probe card (capacitors) to control the size of power system noise spikes caused by the DUT during operation. Also indicated in FIG. 1 is the connection inductance that the interface introduces between the tester power supply and the probe card. When the DUT supply current changes, this connection inductance (L Supply and L GND) can cause significant voltage noise spikes to appear across the power bus system of the probe card. One source of change in the DUT supply current is the application of structural test patterns to the DUT. In a structural test, the DUT 13 is loaded with an input pattern of test vectors, a single clock cycle is applied, and the resultant output vector is read out. Often this test sequence is repeated many times during the course of a test, in rapid succession. When the DUT contains a large number of transistors, this test sequence invariably produces a voltage noise pulse on the power planes of the probe card used to bias the DUT. The noise spike is produced by the momentary increase in current drawn by the chip during the test cycle, which cannot be fully compensated by the on chip decoupling capacitor network.

Figure 2:
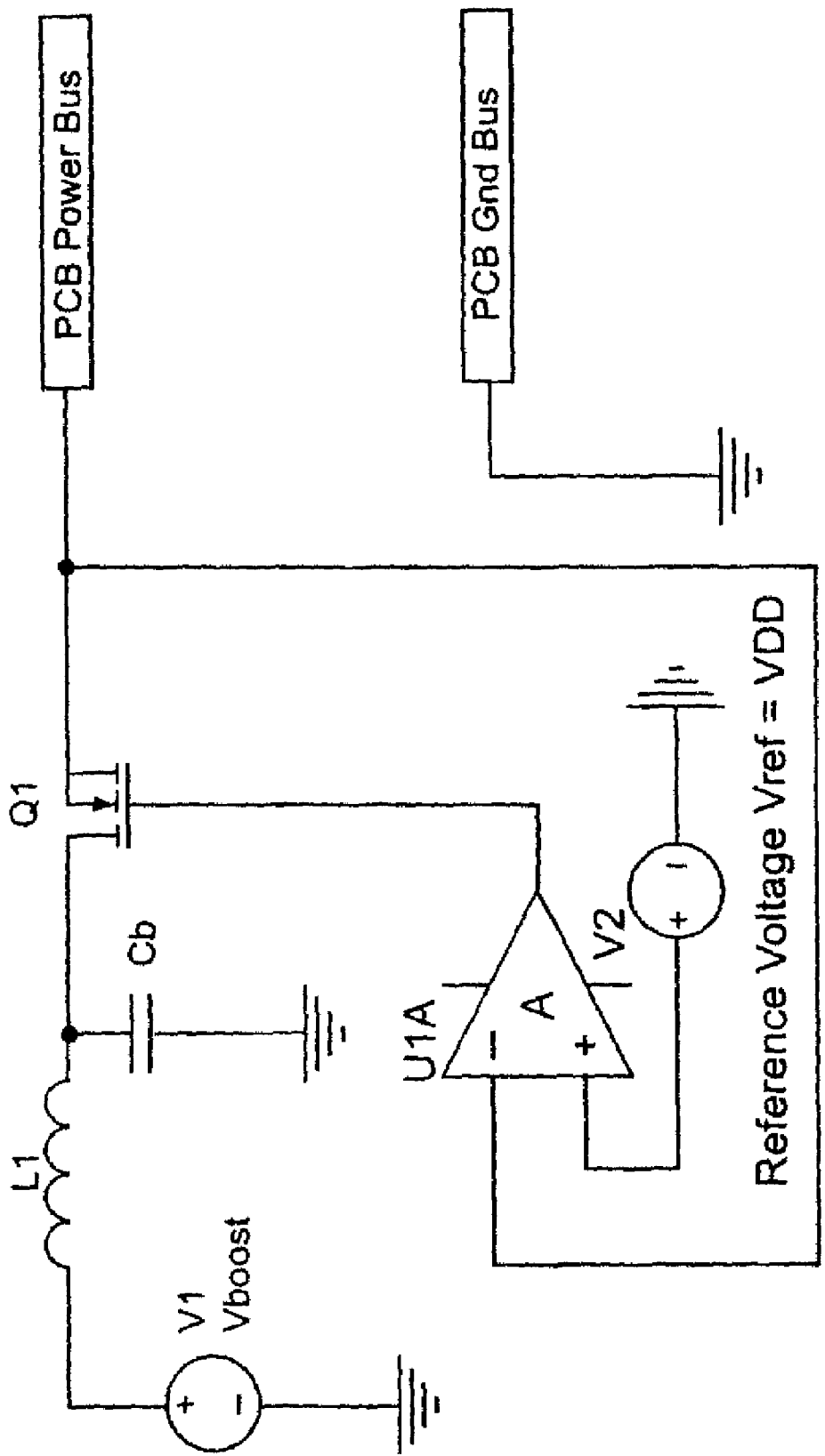
FIG. 2 is a block and schematic diagram of the active bypass noise reduction circuit of the present invention.

A simple implementation of the active bypass circuit according to the present invention is shown in FIG. 2. The booster circuit uses capacitor $C_b$ to store charge to supply current to the probe card power bus (Printed Circuit Board (PCB) Power Bus) during periods of power bus loading. $C_b$, here represented as a single capacitor, is typically a bank of capacitors and is charged to a voltage $V_{boost} \gg VDD$ by voltage source $V_{boost}$, which is external to the probe card. The connection from $V_{boost}$ to $C_b$ may have a significant inductance, as indicated by inductor $L_1$. The time to charge $C_b$ will be determined by $L_1$, $C_b$ and any series parasitic resistance in the $V_{boost}/C_b$ connection. Operational amplifier (op amp) U1A, located on the probe card, monitors the probe card supply bus voltage, and compares this voltage to a reference value provided by voltage reference $V_{ref}$ which is external to the probe card. When the probe card voltage drops below VDD, U1A applies a signal to transistor $Q_1$, allowing current to flow from $C_b$ to the PCB power bus. Normally $Q_1$ is cutoff. Since $C_b$ is charged to high voltage, the boost current can be maintained by the circuit for much longer periods of time than bypass current from a conventionally connected capacitor (a capacitor connected between the PCB power bus and ground). Several points are worth noting:

1. Because op amp U1A is located on the probe card, the time constant of the circuit will be very short, being determined by the open loop bandwidth of U1A and the bandwidth of $Q_1$. Long time constants associated with the external supplies or parasitic elements of the connection network between the power supplies and the probe card will not degrade the frequency response of the active bypass circuitry.

2. Most conventional high capacitance probe card bypass networks employ transistors $Q_1$ to switch the bypass capacitance C in and out of the circuit, so that accurate DUT leakage measurements may be made. Since these transistors are typically included on the probe card now, the implementation of the booster circuit will not reduce the probe card area allotted to bypass capacitance (with the exception of the small area required for mounting U1A).

3. Most high performance ESL and ESR capacitors used for probe card bypass networks have maximum voltage ratings much higher than typical power supply voltages, hence they are presently being used at only a small fraction of their filtering capacity.

Simulation

Figure 3:
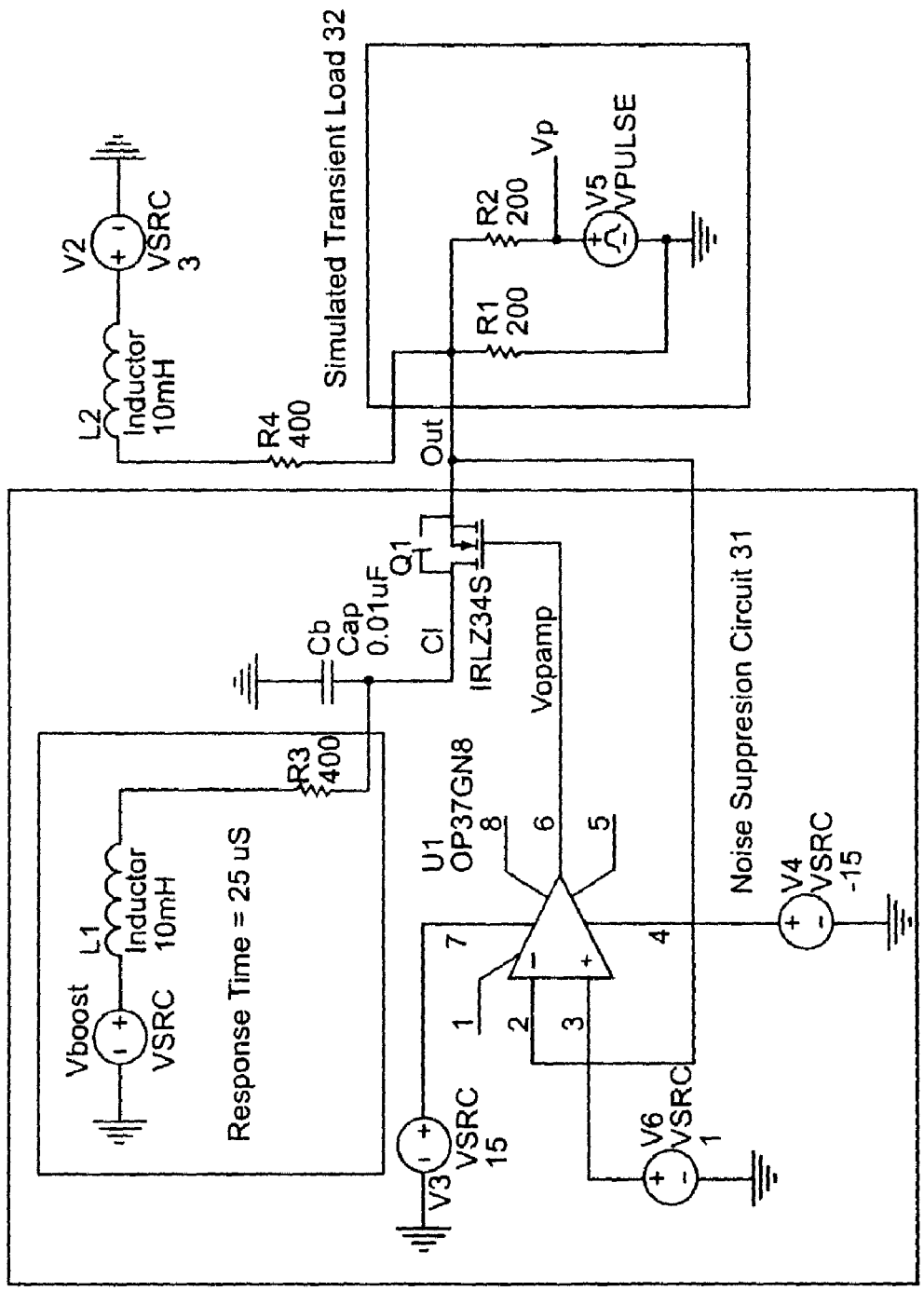
FIG. 3 is a block and schematic diagram of a specific implementation of the active bypass noise reduction circuit with a simulated transient load.

FIG. 3 shows one implementation of the booster circuit, along with a test circuit which simulates a 5 microsecond (μs) impulsive load on the power bus of the DUT. The load components were chosen so that the impulsive load will generate a voltage drop of 48% during the 5 μs loading event. This amount of power bus voltage reduction would probably cause most DUTs to fail a structural test, even if the DUT is perfect. The simulation test circuit comprised a noise suppression circuit 31 connected to a simulated transient load 32. The noise suppression circuit 31 is the circuit of FIG. 2 and includes the capacitor $C_b$, which is charged to $V_{boost}$, and transistor $Q_1$ controlled by op amp U1. The simulated load includes a voltage pulse generator $V_S$.

Figure 4:
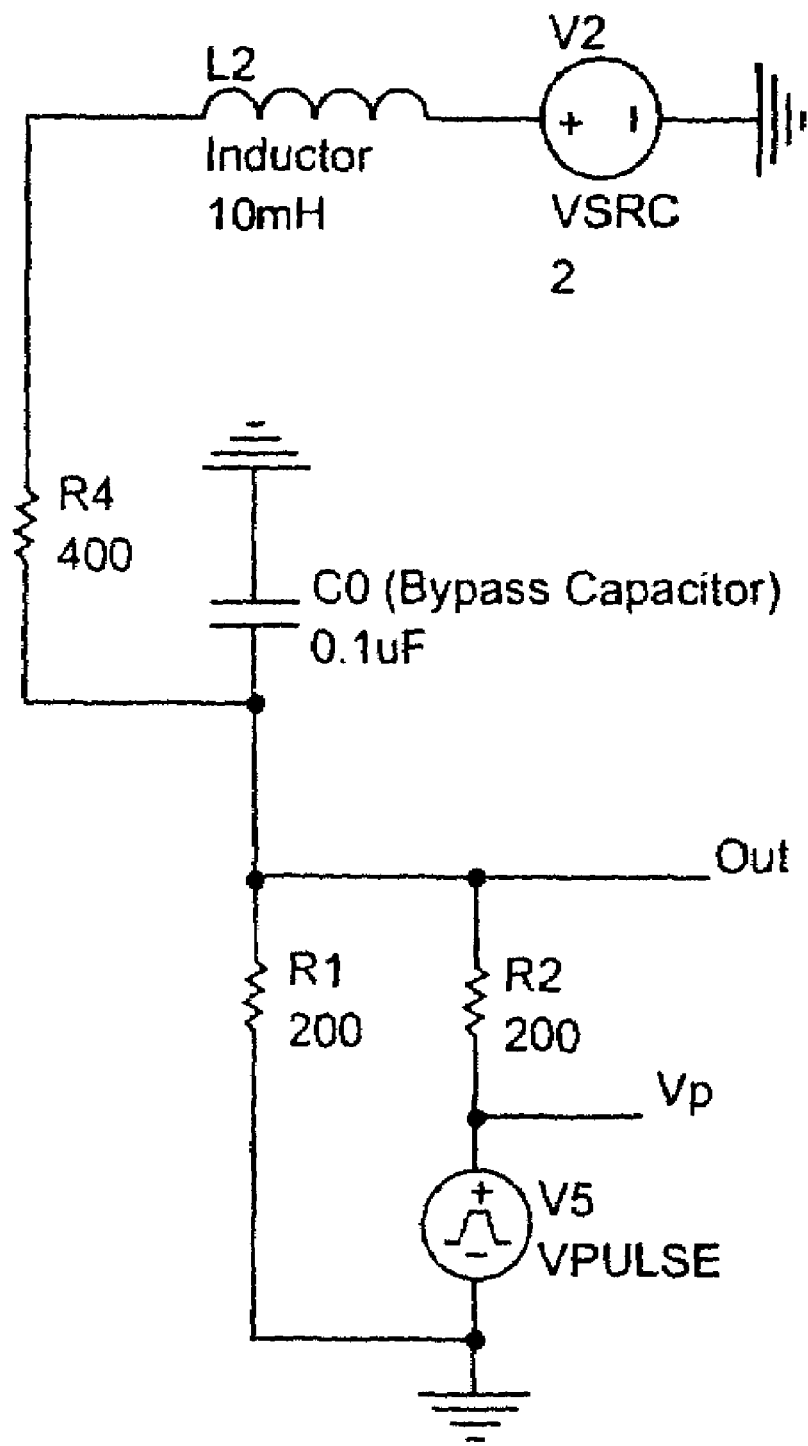
FIG. 4 is a schematic diagram of a passive bypass circuit used for comparison with the active circuit shown in FIG. 3.

FIG. 4 shows an equivalent passive bypass circuit used on conventional probe cards. In the simulations of the active and passive bypass circuits that we describe here, we compare the performance of the active circuit shown in FIG. 3 with the passive circuit shown in FIG. 4 as a function of passive bypass capacitance $C_0$. In the passive circuit, values of $C_0/C_b = 1$, 10, and 50 were used. For both active and passive simulations, the response time of the external power supplies (whether $V_{boost}$ or VDD) was limited to 25 μs, to simulate the response times typical of high current/high performance DUT supplies connected to the probe card through typical probe card interfaces.

Figure 5:
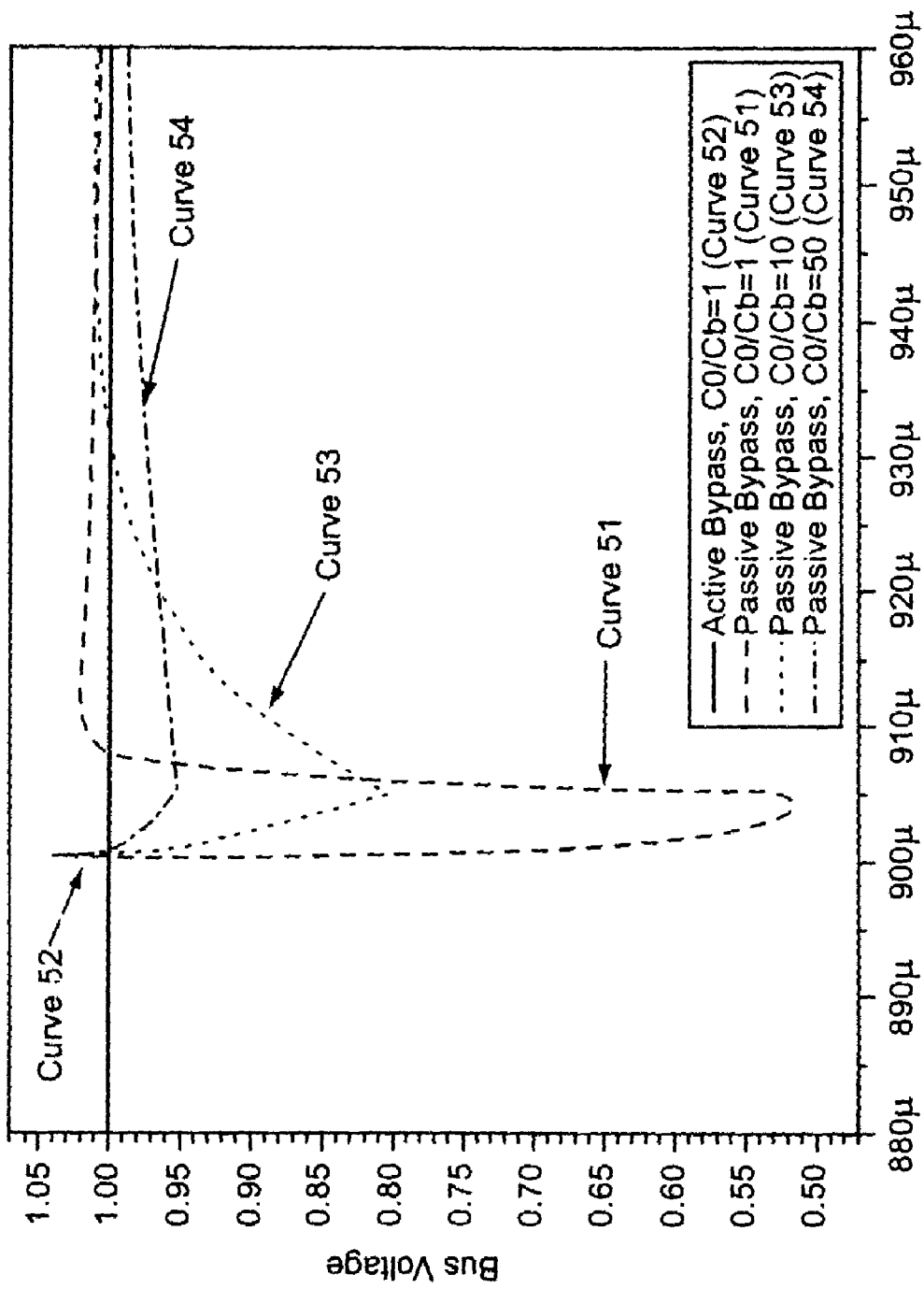
FIG. 5 is a graph of simulation results for active and passive bypass circuits.

FIG. 5 shows the results of the simulation. The curve 51 shows the 48% voltage drop of the reference passive network. The curve 52 shows the response of the active network, using the same value of bypass capacitance ($C_0/C_b=1$) but with $V_{boost}/VDD=10$. The maximum voltage drop is 5%, an improvement of approximately 10 times in noise reduction. Furthermore, as the simulation indicates, after the intrinsic response time of the active circuit (~1 μs) the voltage bus is regulated to better than 0.015% over the remainder of the load. This is in contrast to all passive cases in which the supply voltage continues to decrease until the load is removed.

Also shown in FIG. 5 are comparisons of the performance of the active circuit with $C_0/C_b=1$ to the passive one with $C_0/C_b=10$ (curve 53) and $C_0/C_b=50$ (curve 54). With $C_0/C_b=10$, the bus voltage drops 20% by the end of the test. In order to recover a voltage drop of less than 5%, $C_0/C_b=50$ is required. The key points demonstrated by this simulation are:

1. For a fixed value of bypass capacitance, active bypassing allows a 10 times reduction (worst case) noise reduction over the passive circuit. The average voltage drop of the active circuit is >60× better than the passive circuit (0.4% vs. 24%).

2. For the passive network to achieve the same level of voltage drop as the active circuit, $C_0/C_b=50$ is required. This means that the active network is 50 times more efficient from a component area perspective than the passive network.

3. No attempt was made to optimize the active bypass circuit bandwidth, hence more refined implementations of this basic circuit are expected to yield improved (shorter) response times.

While the invention has been described in terms of a single preferred embodiment, those skilled in the art will recognize that the invention can be practiced with modification within the spirit and scope of the appended claims.

The invention claimed is:

1. An apparatus for testing a voltage drop suppression device for power bus of a probe card used for semiconductor wafer testing, comprising:

a test circuit for simulating an impulsive load on a device under test (DUT) by said probe card, the load components being chosen to generate a voltage reduction during a time period of said impulsive load, said voltage reduction being sufficient to cause the device under test (DUT) to fail a structural test;

a bypass capacitor mounted on the probe card, wherein the bypass capacitor is charged to a voltage greater than a power supply voltage VDD of the device under test being simulated by said test circuit; and an active regulation circuit controlling the discharge of the bypass capacitor to the power bus for suppressing a voltage drop on the power bus generated by a current surge during testing of the device under test, said current surge being simulated by said test circuit, wherein the active regulation circuit comprises a transistor for controlling the discharge of the bypass capacitor, wherein power flowing to the power bus flows through the transistor, and an amplifier providing feedback control of the transistor such that the transistor is turned on as the power bus voltage decreases.

* * * * *